(12) United States Patent
Cantell et al.

(10) Patent No.: US 6,255,179 B1
(45) Date of Patent: Jul. 3, 2001

(54) PLASMA ETCH PRE-SILICIDE CLEAN

(75) Inventors: Marc W. Cantell, Sheldon, VT (US); Kenneth Giewont, Hopewell Junction, NY (US); Jerome B. Lasky; Kirk D. Peterson, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/368,212

(22) Filed: Aug. 4, 1999

(51) Int. Cl.[7] .................... H01L 21/336; H01L 21/3205; H01L 21/4763; H01L 21/44
(52) U.S. Cl. .................... 438/301; 438/592; 438/664
(58) Field of Search .................... 438/301, 664, 438/745, 570, 258, 592

(56) References Cited

U.S. PATENT DOCUMENTS

| | | | |
|---|---|---|---|
| 3,939,798 | * | 2/1976 | Morton ...................... 118/7 |
| 4,058,638 | * | 11/1977 | Morton ...................... 427/39 |
| 4,797,178 | | 1/1989 | Bui et al. . |
| 4,851,295 | | 7/1989 | Brors . |
| 5,007,981 | | 4/1991 | Kawasaki et al. . |
| 5,043,299 | | 8/1991 | Chang et al. . |
| 5,302,236 | | 4/1994 | Tahara et al. . |
| 5,304,405 | | 4/1994 | Kobayashi et al. . |
| 5,346,586 | * | 9/1994 | Keller ...................... 156/656 |
| 5,413,670 | * | 5/1995 | Langan et al. ............... 134/1.2 |
| 5,422,308 | * | 6/1995 | Nicholls et al. .............. 437/192 |
| 5,463,271 | * | 10/1995 | Geis et al. .................. 313/346 R |
| 5,728,625 | | 3/1998 | Tung . |
| 5,753,567 | | 5/1998 | Banan et al. . |
| 5,759,360 | | 6/1998 | Ngan et al. . |
| 5,783,495 | | 7/1998 | Li et al. . |
| 5,990,021 | * | 11/1999 | Prall et al. .................. 438/745 |
| 6,034,419 | * | 3/2000 | Nicholls et al. .............. 257/641 |
| 6,063,704 | * | 5/2000 | Demirlioglu ................. 438/664 |
| 6,096,629 | * | 8/2000 | Tsai et al. .................. 438/570 |

* cited by examiner

*Primary Examiner*—John F. Niebling
*Assistant Examiner*—Walter L. Lindsay, Jr.
(74) *Attorney, Agent, or Firm*—DeLio & Peterson; John J. Tomaszewski; William D. Sabo

(57) ABSTRACT

A method of preparing silicon semiconductor surfaces prior to metal silicide formation. In particular, it teaches a method of treating about 10 to about 200 Å of a surface of the silicon with a plasma source after activating the source and drain regions, prior to an HF etch and deposition of a metal for silicide formation. Discontinuities in the metal silicide formed on narrow polysilicon lines at the point where source and drain regions intersect are surprisingly diminished. This results in more continuous, uniform silicide formation hence the polysilicon lines and the source and drain regions have substantially lower resistance.

26 Claims, 2 Drawing Sheets

PLASMA ETCH PRE-SILICIDE CLEAN

BACKGROUND OF THE INVENTION

1. Field of the Invention

This invention is directed to the manufacture of semiconductor components and, in particular, to the formation of field effect transistors having decreased resistance.

2. Description of Related Art

Typically, in forming a field effect transistor (FET), a silicon substrate is provided having diffusion areas and isolation trenches formed thereon. The substrate may be a silicon on insulator (SOI) substrate with shallow trench isolations. Diffusion areas such as N-wells and P-wells are formed by implantation and annealing methods well known in the art.

An oxide may be grown and polysilicon deposited on the surface of the substrate, patterned with a photoresist, and etched to form desired gate structures. Once the polysilicon gate structures are in place, spacers are formed adjacent to the gates to tailor the FET appropriately and prevent shorting of the gate to the diffusion areas. A conformal dielectric layer of silicon nitride or silicon oxide is deposited over the substrate and gate structures. The conformal dielectric layer is then isotropically etched to leave side wall spacers on either side of each gate structure.

To form the source and drain regions on the FET, dopants such as boron, and phosphorus are implanted into the wafer. A photoresist is applied to the substrate and patterned. The pattern leaves exposed areas on the substrate where a first dopant, for example a P+ dopant, is implanted to form a P+ source region and P+ drain region as well as dope the polysilicon gate structures. Thereafter, the photoresist is stripped and a reverse photoresist is applied which has a pattern corresponding to a N+ dopant. The second dopant is then imbedded into the wafer. Once the source and drain regions are formed, the wafer is annealed to activate the source and drain regions.

Typically, once the source and drain regions are formed, a metal is deposited on the surface of the wafer to form the metal silicide which reduces the resistance of the polysilicon lines. However, contaminants from the previous processing may cause discontinuities in the metal silicide formation by preventing the metal from fully reacting with the polysilicon. The discontinuities increase the resistance of the polysilicon lines and the source and drain regions.

Prior to silicide formation, the wafer is typically cleaned by a series of wet and dry cleans to remove contaminants. These cleans are intended to remove contaminants such as resist residuals, implant residuals, metals, and particles from the surface of the silicon wafer. However, these cleans while removing some or all of the native oxide do not remove more than a few mono-layers of silicon from the substrate and are insufficient to substantially remove all contaminants.

Bearing in mind the problems and deficiencies of the prior art, it is therefore an object of the present invention to provide a method of removing contaminants from a surface and a top layer of a silicon wafer prior to silicide formation to reduce discontinuities in the metal silicide.

It is another object of the present invention to provide a method of forming a metal silicide having lower resistance on a silicon wafer.

A further object of the present invention is to provide a method of forming a field effect transistor having reduced resistance in the polysilicon lines and the source and drain regions.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of preparing a silicon wafer for silicide formation comprising the steps of: (a) providing a silicon wafer having formed thereon doped source and drain regions, the source and drain regions having polysilicon gates; (b) activating the source and drain regions; (c) providing a plasma source; and (d) treating the surface of the wafer with the plasma source, wherein subsequent silicide formation on the wafer has substantially reduced discontinuities and lowered resistance.

The present invention is directed to, in another aspect, a method of forming a silicide layer having reduced discontinuities and lowered resistance on a silicon wafer comprising the steps of: (a) providing a silicon wafer having activated source and drain regions formed thereon, the source and drain regions having polysilicon gate structures; (b) placing the silicon wafer in a chamber and providing a plasma source; (c) reacting a sufficient depth of a surface of the silicon wafer with the plasma source; (d) etching the surface of the wafer with hydrofluoric acid; and (e) depositing a metal on the surface of the silicon wafer.

The present invention is directed to, in yet another aspect, a method of forming a field effect transistor having lowered resistance comprising the steps of: (a) providing a silicon wafer having diffusion areas and isolation areas with polysilicon gate structures having side wall spacers thereon; (b) forming source and drain regions by doping the wafer at desired sites and activating the source and drain regions; (c) reacting a sufficient depth of the wafer having activated source and drain regions with a plasma source such that contaminants on the surface of the wafer are treated with the plasma source; (d) etching the surface of the wafer with hydrofluoric acid to further remove contaminants on the surface of the wafer; and (e) depositing a metal on the surface of the wafer and forming a metal silicide thereon.

In practicing the present invention, the plasma source most preferably treats the surface of the wafer in a controllable manner and to a sufficient depth such that device parametrics on the wafer remain intact.

The plasma source may, preferably, comprise an ozone plasma at about 350 to about 450 Watts, at a pressure of about 6 to about 10 mTorr, at a temperature of about 350 to about 450° C. with an ozone flow rate of about 3700 to about 4100 sccm to substantially oxidize about 10 to about 200 Å of a surface of the wafer.

The plasma source may, preferably, comprise an $NF_3/Ar$ plasma source at about 40 to about 80 Watts, at a pressure of about 10 to about 35 mTorr, at a temperature of about 17 to about 45° C. with an Ar flow rate of about 75 to about 125 sccm and an $NF_3$ flow rate of about 3.75 to about 6.25 sccm to etch about 10 to about 200 Å of a surface of the wafer.

The plasma source may also, preferably, comprise a plasma containing a fluorocarbon at about 75 to about 125 Watts, at a pressure of about 20 to about 60 mTorr, at a temperature of about 10 to about 45° C. with an $O_2$ flow rate of about 30 to about 90 sccm and a $CHF_3$ flow rate of about 30 to about 90 sccm to etch about 10 to about 200 Å of a surface of the wafer.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(S)

Figure 1:
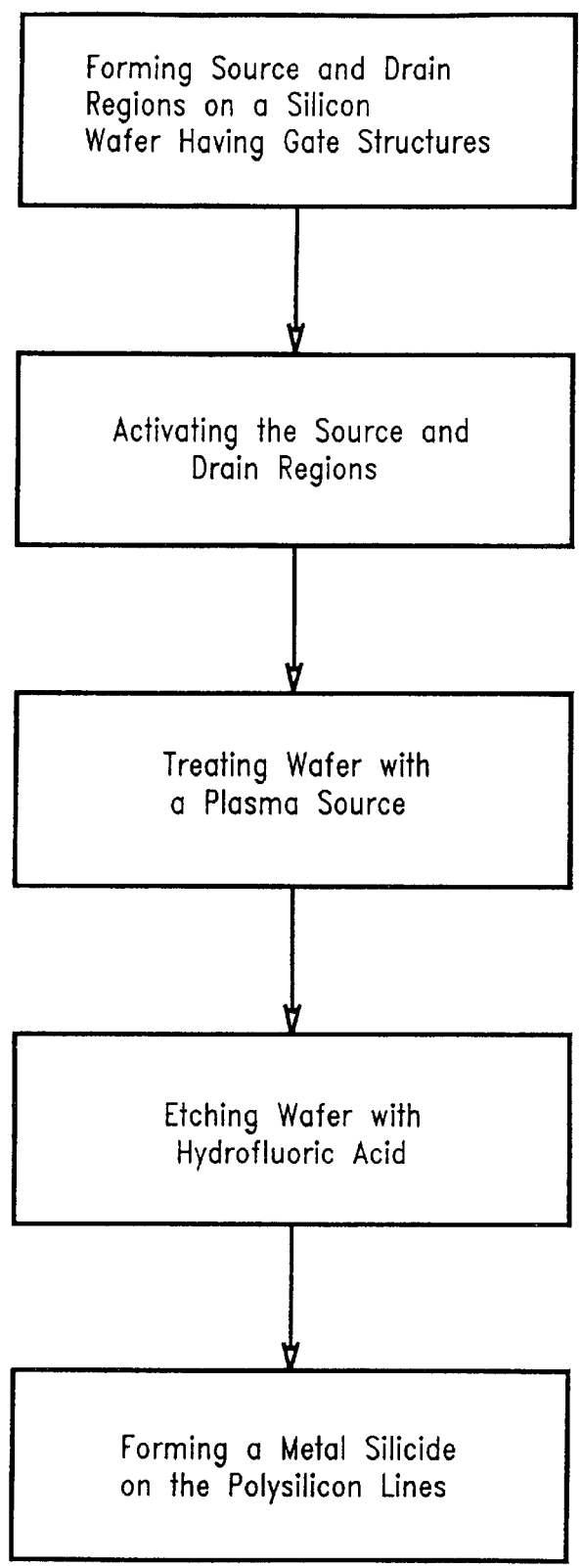
FIG. 1 is a flow diagram illustrating a method of the present invention.

In describing the preferred embodiment of the present invention, reference will be made herein to FIGS. 1–2 of the drawings in which like numerals refer to like features of the invention. Features of the invention are not necessarily shown to scale in the drawings.

The present invention relates to the formation of field effect transistors (FETs) on a semiconductor wafer. Unexpectedly, it has been found that treating the surface of the silicon after activating the source and drain regions and prior to metal silicide formation enhances silicide formation and decreases the discontinuities in the silicide formed, thus, reducing the resistance of the polysilicon lines. FIG. 1 illustrates a preferred embodiment of the present invention.

The surface preparation taught in the present invention is a benefit when forming titanium silicide ($TiSi_2$) and cobalt silicide ($CoSi_2$), as well as other metal silicides. This is particularly useful since the polysilicon gate line width shrinks below 0.2 $\mu$m as is required for sub-quarter micron ground rule technologies. As the line width shrinks, any discontinuity of the silicide has a greater impact on device parametrics.

During formation of the FETs, the silicon wafers have opportunities to be contaminated in a variety of means. For example, some contaminants are resist residuals, drying stains, residual spacer nitride, knocked-on carbon at the edge of implant blocking resists, as well as others.

The present invention preferably treats about 10 to about 200 Å of the surface of the silicon wafer with a plasma source. This surface treatment is adapted not to disturb the delicate circuitry formed on the wafer. The surface treatment treats a sufficient amount of the silicon surface such that contaminants found on the silicon surface do not interfere with formation of the metal silicide. The result is a lower incidence of discontinuities in the metal silicide formed on the polysilicon lines as well as lower resistance silicide.

Figure 2:
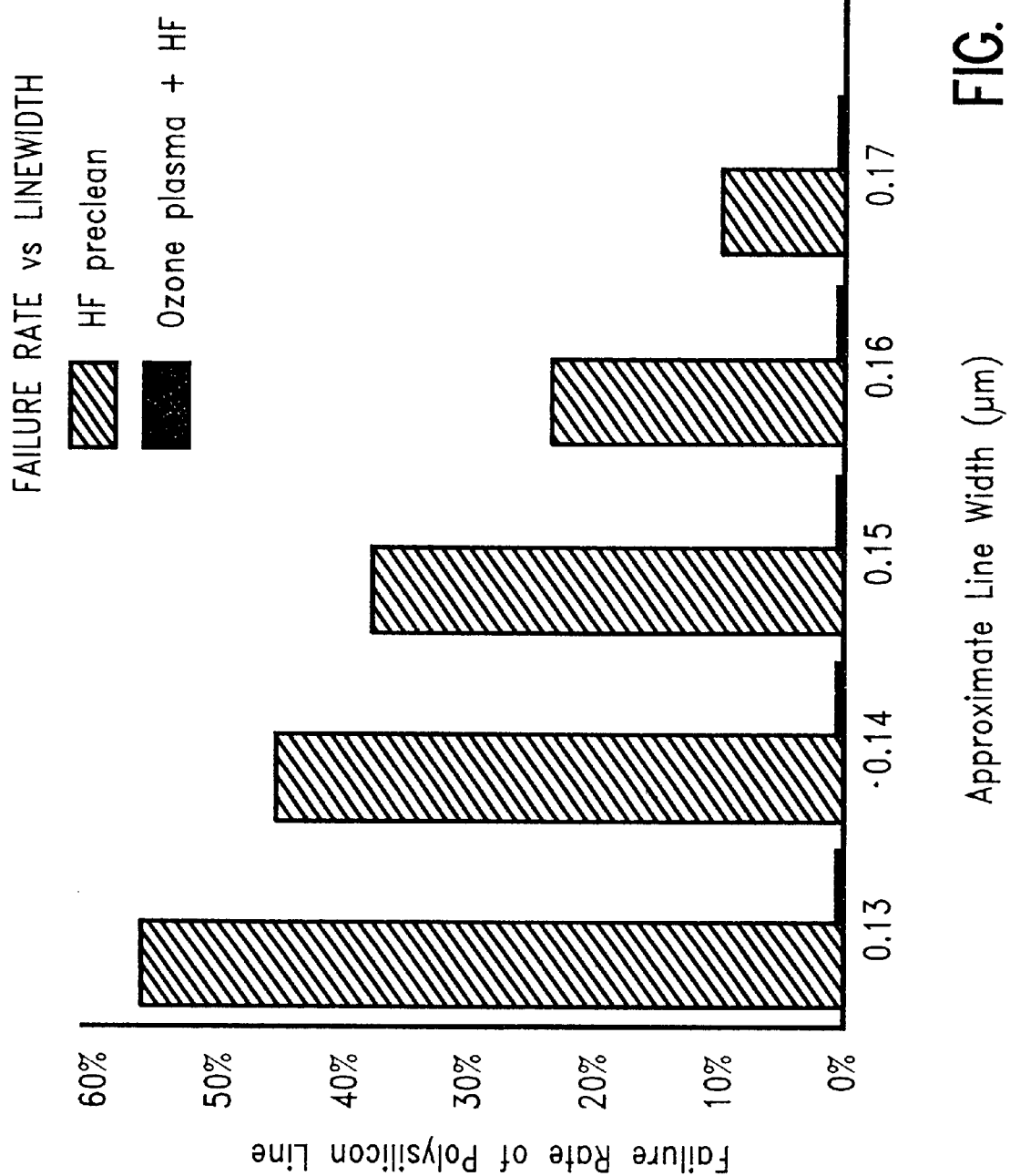
FIG. 2 is a graph depicting the failure rate of the polysilicon line plotted against the line width.

FIG. 1 illustrates a preferred embodiment of the present invention. Once the source and drain regions are formed and activated according to known means in the art, the silicon substrate is treated with a plasma source.

In a first embodiment, preferably about 10 to about 200 Å, more preferably about 15 to about 30 Å, of the surface of the silicon wafer is oxidized. Preferably, a plasma source such as an ozone gas plasma due to its demonstrated effectiveness is utilized to oxidize a surface of the wafer. Other plasma sources capable of oxidizing the silicon surface may also be employed.

The silicon wafer is placed in a typical chemical vapor deposition chamber such as a Model 5000 CVD chamber available from Applied Materials Engineering, Santa Clara, Calif. The ozone plasma is preferably ignited at about 350 to about 450 Watts under the following conditions: a pressure of about 6 to about 10 mTorr, at a temperature of about 350 to about 450° C. with an ozone flow rate of about 3700 to about 4100 sccm. More preferably, the ozone plasma is ignited at about 400 Watts, at about 8.5 mTorr, and at about 400° C. with an ozone flow rate of about 3900 sccm.

The surface silicon has been found to harbor impurities such as knocked-on carbon from the mask implant steps at the edges of the masking patterns. During the oxidation process, these surface contaminants, such as the knocked-on carbon, will be volatilized and removed. This impurity containing layer is the target of the oxidation. The oxidation also serves to convert the surface silicon to silicon dioxide ($SiO_2$). When the impurity containing layer on the surface silicon is converted to the oxide, it can be easily removed using a subsequent hydrofluoric acid (HF) etch which is highly selective to silicon dioxide.

In a second preferred embodiment, a fluorocarbon chemistry, or fluorine based etchant, such as $NF_3/Ar$, is used in a plasma etch to again clean the surface of the silicon, as well as consume some of the silicon surface. It is important that the plasma used to etch any native oxide, as well as the silicon surface, is controllable. The etch is targeting preferably between about 10 to about 200 Å of the silicon surface. Preferably about 20 to 80 Å of the silicon surface although more material may be removed as long as it does not adversely impact the device parameterics.

The silicon wafer is placed in a typical reactive ion etching chamber such as a MXP etch chamber available from Applied Materials Engineering, Santa Clara, Calif. The plasma preferably ignited at about 40 to about 80 Watts, at a pressure of about 10 to about 35 mTorr, at a temperature of about 17 to about 45° C. Where the etchant is an $NF_3/Ar$ chemistry, the Ar flow rate is about 75 to about 125 sccm and the $NF_3$ flow rate is about 3.75 to about 6.25 sccm. Most preferably, where an $NF_3/Ar$ plasma is used, the plasma is ignited at about 65 Watts under the following conditions: a pressure of about 20 mTorr, at about 30° C. with an Ar flow rate of about 5 sccm and an $NF_3$ flow rate of about 60 sccm.

Following the plasma treatment is a hydrofluoric acid (HF) etch to remove any native oxide that results from exposure of silicon to air at room temperature. The HF etch is commonly used in semiconductor manufacture and proper conditions would be known to those skilled in the art. Following the HF etch, a metal is deposited on the surface of the silicon wafer. Metals such as titanium and cobalt are used to form the silicide. Other metals capable of forming silicides may also be utilized, for example, the transition metals. A depth of approximately 200 to 700 Å of the polysilicon is used to form the metal silicide depending upon the amount of metal deposited. The metal layer should preferably be deposited within about 2 hours after the plasma treatment so as to avoid the formation of additional native oxide on the surface of the wafer resulting from exposure to air.

A metal, preferably cobalt or titanium, may be deposited on the surface of the silicon wafer by any suitable technique known to those skilled in the art. For example, if a cobalt silicide is to be formed, a sputtering process may be used where the silicon wafer is placed in a depressurized chamber containing argon (Ar) gas and a region of cobalt. A voltage applied to the chamber ionizes the argon atoms into $Ar^+$ ions and then accelerates the $Ar^+$ ions to move within the chamber. A percentage of the accelerated $Ar^+$ ions strikes the region of cobalt to form gaseous cobalt with moving cobalt atoms. A portion of the moving cobalt atoms adheres to the silicon wafer. Generally, a cobalt thickness of about 80 Å is preferred.

The metal may be placed in intimate contact with the silicon to react without the contaminants from prior processing. Silicide formation proceeds in the conventional manner of a sequence of anneals and selective stripping of unreacted material. While the time and temperature of the anneal may vary within limits known to those of ordinary skill in the art, a temperature range of about 540° C. to about 600° C. for a time period of about 5 seconds to about 2 minutes are representative.

In order to monitor the effectiveness of the method of the present invention, a long and narrow polysilicon serpentine was used to measure the sheet resistance. The polysilicon serpentine used has over one million P/N junctions. The P/N junction is a site where knocked-on carbon on the silicon surface from the implant blocking resist blocks the reaction of the metal and silicon leading to frequent failure to form silicide. The graph in FIG. 2 illustrates the failure rate of the monitor with and without the ozone plasma clean versus the approximate width of the polysilicon line. The narrower lines are obviously more likely to have a break in the metal silicide going completely across the line.

It is seen that with the prior art, i.e., having only an HF clean prior to cobalt silicide formation, the percentage of test structures which fail due to high resistance increased from about 10% to about 55% as the gate conductor polysilicon line width decreased from about 0.17 $\mu$m to about 0.13 $\mu$m. Surprisingly, with the removal of about 20 Å of the surface silicon, labeled "ozone plasma+HF," the failure rate is less than 1% and shows almost no line width effect. It is highly desirable to utilize the plasma treatment after activating the source and drain regions to obtain the maximum benefits.

The present invention achieves the objects recited above. The surface treatment taught in the present invention utilizes a plasma source to treat a surface depth of the silicon wafer to volatilize contaminants or react with contaminants such that a later etch with hydrofluoric acid substantially removes the contaminants from the wafer surface. Substantial removal of the contaminants reduces discontinuities when forming the metal silicide such that the resistance of the polysilicon lines and the source and drain regions are reduced.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of preparing a silicon wafer for silicide formation comprising in the following sequence the steps of:
    (a) providing a silicon wafer having formed thereon doped source and drain regions, the source and drain regions having polysilicon gates;
    (b) activating the source and drain regions;
    (c) providing a plasma source;
    (d) treating the surface of said wafer with said plasma source;
    (e) etching the surface of said wafer with hydrofluoric acid; and
    (f) depositing a metal on at least a portion of said wafer;
    wherein subsequent suicide formation on the wafer has substantially reduced discontinuities.

2. The method of claim 1 wherein step (d) comprises treating the surface of said wafer with said plasma source to a sufficient depth such that device parametrics on said wafer remain intact.

3. The method of claim 1 wherein during step (d) said plasma source is treating contaminants on the surface of said wafer.

4. The method of claim 1 wherein step (c) comprises providing an ozone plasma at about 350 to about 450 Watts, at a pressure of about 6 to about 10 mTorr, at a temperature of about 350 to about 450° C. with an ozone flow rate of about 3700 to about 4100 sccm.

5. The method of claim 4 wherein step (d) comprises oxidizing about 10 to about 200 Å of a surface of the wafer by said ozone plasma source.

6. The method of claim 1 wherein step (c) comprises providing an NF$_3$/Ar plasma source at about 40 to about 80 Watts, at a pressure of about 10 to about 35 mTorr, at a temperature of about 17 to about 45° C. with an Ar flow rate of about 75 to about 125 sccm and an NF$_3$ flow rate of about 3.75 to about 6.25 sccm.

7. The method of claim 6 wherein step (d) comprises etching about 10 to about 200 Å of a surface of the wafer by said NF$_3$/Ar plasma source.

8. The method of claim 1 wherein in step (c) said semiconductor wafer is treated with a plasma containing a fluorocarbon at about 75 to about 125 Watts, at a pressure of about 20 to about 60 mTorr, at a temperature of about 10 to about 45° C. with an O$_2$ flow rate of about 30 to about 90 sccm and a CHF$_3$ flow rate of about 30 to about 90 sccm.

9. The method of claim 8 wherein in step (d) comprises reacting about 10 to about 200 Å of a surface of the wafer to said plasma containing a fluorocarbon.

10. A method of forming a silicide layer having reduced discontinuities and lowered resistance on a silicon wafer comprising in the following sequence the steps of:
    (a) providing a silicon wafer having activated source and drain regions formed thereon, the source and drain regions having polysilicon gate structures;
    (b) placing said silicon wafer in a chamber and providing a plasma source;
    (c) reacting a sufficient depth of a surface of said silicon wafer with said plasma source;
    (d) etching the surface of said wafer with hydrofluoric acid; and
    (e) depositing a metal on the surface of said silicon wafer.

11. The method of claim 10 wherein step (e) comprises sputter depositing a metal on the surface of said silicon wafer.

12. The method of claim 11 wherein in step (e) said metal is selected from the group consisting of cobalt, titanium, tungsten, nickel and other metals capable of forming a metal silicide.

13. The method of claim 10 wherein step (c) comprises reacting the surface of said silicon wafer with a plasma source to such a depth that device parametrics of the wafer remain intact.

14. The method of claim 10 wherein step (b) comprises providing an ozone plasma at about 350 to about 450 Watts, at a pressure of about 6 to about 10 mTorr, at a temperature of about 350 to about 450° C. with an ozone flow rate of about 3700 to about 4100 sccm.

15. The method of claim 14 wherein step (c) comprises oxidizing about 10 to about 200 Å of the surface of said silicon wafer with said ozone plasma source.

16. The method of claim 14 wherein step (c) comprises oxidizing about 10 to about 20 Å of the surface of said silicon wafer with said ozone plasma source.

17. The method of claim 10 wherein step (b) comprises providing a plasma containing a fluorocarbon at about 75 to about 125 Watts, at a pressure of about 20 to about 60 mTorr, at a temperature of about 10 to about 45° C. with an $O_2$ flow rate of about 30 to about 90 sccm and a $CHF_3$ flow rate of about 30 to about 90 sccm.

18. The method of claim 17 wherein step (c) comprises reacting about 10 to about 200 Å of the surface of said silicon wafer to said plasma containing a fluorocarbon.

19. The method of claim 17 wherein step (c) comprises reacting about 20 to about 80 Å of the surface of said silicon wafer to said plasma containing a fluorocarbon.

20. The method of claim 10 wherein step (e) comprises depositing cobalt on the surface of said silicon wafer.

21. A method of forming a field effect transistor having lowered resistance comprising in the following sequence the steps of:

(a) providing a silicon wafer having diffusion areas and isolation areas with polysilicon gate structures having side wall spacers thereon;

(b) forming source and drain regions by doping said wafer at desired sites and activating said source and drain regions;

(c) reacting a sufficient depth of said wafer having activated source and drain regions with a plasma source such that contaminants on the surface of said wafer are treated with said plasma source;

(d) etching the surface of said wafer with hydrofluoric acid to further remove contaminants on the surface of said wafer; and (e) depositing a metal on the surface of said wafer and forming a metal silicide thereon.

22. A method of forming a silicide layer having reduced discontinuities and lowered resistance on a silicon wafer comprising the steps of:

(a) providing a silicon wafer having activated source and drain regions formed thereon, the source and drain regions having polysilicon gate structures;

(b) placing said silicon wafer in a chamber and providing a $NF_3/Ar$ plasma source at about 40 to about 80 Watts, at a pressure of about 10 to about 35 mTorr, at about 17 to about 45° C. with a $NF_3$ flow rate of about 3.75 to about 6.25 sccm and an Ar flow rate of about 75 to about 125 sccm;

(c) reacting a sufficient depth of a surface of said silicon wafer with said plasma source;

(d) etching the surface of said wafer with hydrofluoric acid; and (e) depositing a metal on the surface of said silicon wafer.

23. The method of claim 22 wherein step (c) comprises etching about 10 to 200 Å of the surface of said silicon wafer with said $NF_3/Ar$ plasma source.

24. The method of claim 22 wherein in step (d) comprises etching about 30 to about 50 Å of the surface of said silicon wafer with said $NF_3/Ar$ plasma source.

25. A method of preparing a silicon wafer for silicide formation comprising the steps of:

(a) providing a silicon wafer having formed thereon doped source and drain regions, the source and drain regions having polysilicon gates;

(b) activating the source and drain regions;

(c) providing a $NF_3/Ar$ plasma source at about 40 to about 80 Watts, at a pressure of about 10 to about 35 mTorr, at a temperature of about 17 to about 45° C. with an Ar flow rate of about 75 to about 125 sccm and a $NF_3$ flow rate of about 3.75 to about 6.25 sccm; and (d) treating the surface of said water with said plasma source, wherein subsequent silicide formation on the wafer has substantially reduced discontinuities.

26. The method of claim 25 wherein step (d) comprises etching about 10 to about 200 Å of a surface of the wafer by said $NF_3/Ar$ plasma source.

* * * * *